United States Patent [19]
McLeod

[11] Patent Number: 5,980,269
[45] Date of Patent: Nov. 9, 1999

[54] INTERCONNECT ARRANGEMENT FOR PRINTED CIRCUITS

[75] Inventor: Rob McLeod, Nepean, Canada

[73] Assignee: Mitel Corporation, Kanata

[21] Appl. No.: 08/899,047

[22] Filed: Jul. 23, 1997

[30] Foreign Application Priority Data

Jul. 29, 1996 [CA] Canada ................................. 2182237

[51] Int. Cl.$^6$ .................................................. H01R 9/09
[52] U.S. Cl. ............................................................. 439/67
[58] Field of Search ........................... 439/67, 507, 502, 439/65, 59

[56] References Cited

U.S. PATENT DOCUMENTS

| | | | |
|---|---|---|---|
| 3,597,660 | 8/1971 | Jenson ....................................... | 439/59 |
| 4,255,613 | 3/1981 | Ketchpel . | |
| 4,408,814 | 10/1983 | Takashi et al. . | |
| 5,041,016 | 8/1991 | Macado et al. . | |

FOREIGN PATENT DOCUMENTS 2 087 665   5/1982   United Kingdom .
2 218 580   11/1989   United Kingdom .

*Primary Examiner*—Neil Abrams
*Assistant Examiner*—Javaid Nasri
*Attorney, Agent, or Firm*—Marks & Clerk

[57] ABSTRACT

A printed circuit assembly comprises a first printed circuit (5) having conductive (4) paths formed on a top surface (27) thereof and a second printed circuit (1) having conductive paths (2) formed on a top surface thereof. The first printed circuit overlies the second circuit in a staggered relationship so that an edge thereof lies on the top surface of the second printed circuit. The second printed circuit has a portion protruding beyond this edge. A first set of contact members (13) is formed on the first printed circuit adjacent its edge. A second set of corresponding contact members (14) is formed on the protruding portion of the second printed circuit in opposing relationship to the first set of contact members. A sheet member is fitted over the printed circuits and carries bridging members for establishing electrical contact between corresponding pairs of contact members.

9 Claims, 1 Drawing Sheet

INTERCONNECT ARRANGEMENT FOR PRINTED CIRCUITS

FIELD OF THE INVENTION

This invention relates to printed circuit assemblies, and in particular to an interconnect arrangement for establishing electrical connections between adjacent printed circuits. The invention is particularly well suited to the construction of keypads employing elastomeric dome technology. The invention also relates to a method of making printed circuit assemblies.

BACKGROUND OF THE INVENTION

In the electronics industry, keypads are often formed by laying out contacts on a flexible printed circuit. An elastomeric membrane formed with domes is then laid over the flexible printed circuit. The domes have conductive tops so that when they are depressed they bridge the underlying electrical contacts to complete the connection. Such keypads can be used in telephones, calculators and the like.

Some method must be found to attach the flexible printed circuit containing the keypad contacts to the underlying printed circuit board so that the appropriate electrical connections are made. A common technique is to use end connectors or "Zebra strip" connectors mounted on the printed circuit board into which a tongue formed on the end of the flexible circuit can be plugged.

The problem with this technique is that the connectors take up valuable space and also increase the time and complexity of assembly. In order to mass produce the keypads, it is desirable that assembly be a simple as possible so that it lends itself to automation.

An object of the invention is to alleviate the aforementioned problems.

SUMMARY OF THE INVENTION

According to the present invention there is provided a printed circuit assembly comprising a first keypad assembly comprising a lower printed circuit board having conductive paths formed on an upper surface thereof, an upper printed circuit board having conductive paths formed on an upper surface thereof leading to a keypad array, said upper printed circuit board ying partially on said lower printed circuit board in a staggered relationship so that an edge of said upper printed circuit board lies on the upper surface of said lower printed circuit board, said lower printed circuit board having a portion protruding beyond said edge of said upper printed circuit board, a first set of contact members formed on said upper printed circuit board adjacent said edge of said upper printed circuit board, a second set of corresponding contact members formed on said protruding portion of said lower printed circuit board in opposing relationship to said first set of contact members, and a planar sheet member incorporating dome actuators for said keypad fitted over said upper and lower printed circuit boards, said planar sheet member being provided on the underside thereof with planar conductive strips bridging corresponding opposing pairs of said contact members to establish electrical contact therebetween.

For convenience, the assembly has been described with the second printed circuit on top although of course the orientation is immaterial.

The second overlying printed circuit is preferably of the flexible type carrying keypad contacts, in which case the overlying sheet may be an elastomeric membrane with an array of domes for closing the keypads in a manner known in the art.

The bridging members can be in the form of conductive tracks or jumpers screened onto the elastomer or alternatively made from conductive elastomer in a manner known per se.

The invention also provides a method of assembling a keypad, comprising the steps of placing an upper printed circuit board having conductive paths leading to a keypad array formed on an upper surface thereof over a lower printed circuit board having conductive paths formed on an upper surface thereof such that said upper printed circuit board partially overlies said lower printed circuit board in a staggered relationship with an edge of the upper printed circuit board lying on a protruding portion of the upper surface of the lower printed circuit board, aligning a first set of contact members formed on said upper printed circuit board adjacent said edge thereof with a second set of corresponding contact members formed on said protruding portion of said lower printed circuit board, and fitting a planar sheet member incorporating dome actuators for the keypad over said printed circuit boards, said planar sheet member being provided on the underside thereof with planar conductive strips bridging corresponding opposing pairs of said contact members to establish electrical contact therebetween.

BRIEF DESCRIPTION OF THE DRAWINGS

The invention will now be described in more detail, by way of example only, with reference to the accompanying drawings, in which.

DESCRIPTION OF THE PREFERRED EMBODIMENTS

Figure 1:
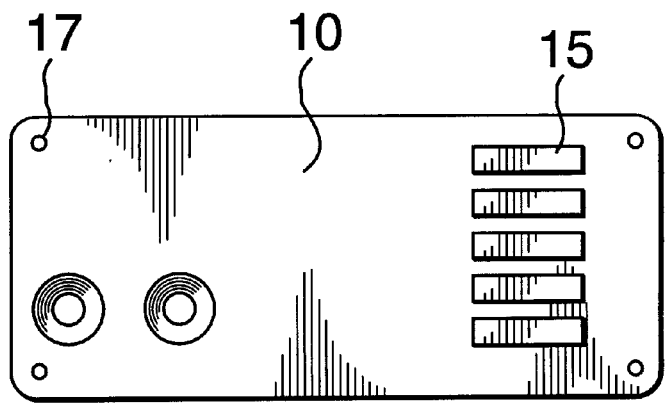
FIG. 1 is an underneath view of an elastomeric membrane.
Figure 2:
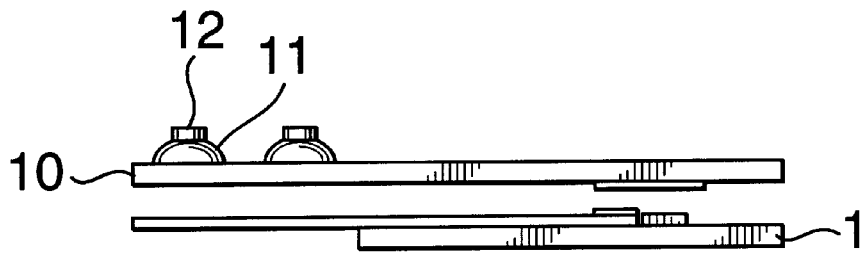
FIG. 2 is an edge view of a printed circuit assembly in accordance with the invention.
Figure 3:
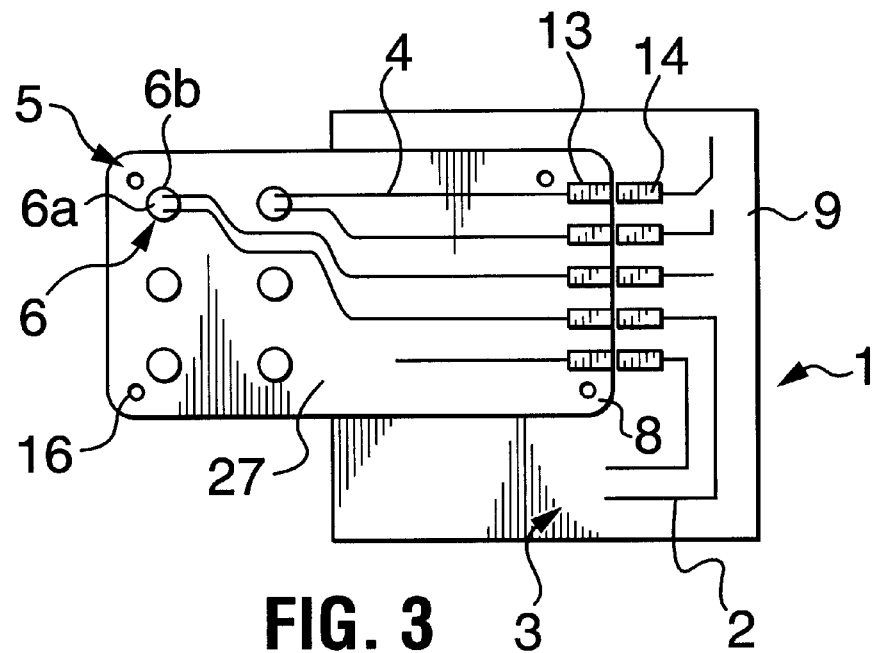
FIG. 3 is a plan view of the printed circuit assembly shown in FIG. 2.

Referring now to the drawings, the printed circuit assembly comprises a printed circuit board 1, which may be either double or single sided, having conductive tracks 2 formed on its upper surface 3 in a manner well known in the art. Board 1 will generally be stiff, but could be flexible.

Onto printed circuit board 1 is laid a flexible printed circuit 5 also having tracks 4 formed on its upper surface 27 in a manner known per se. The tracks 4 lead to an array of contact pads 6 forming part of a membrane-type keypad assembly. The printed circuit 2 lies on the upper surface 3 of the board 1 in a staggered relationship so that its edge 8 meets a protruding portion 9 of the underlying board 1.

An elastomeric membrane 10 with domes 11 corresponding to the locations of the contact pads 6 is laid over the flexible printed circuit 6. The domes 11 have conductive tips 12 which bridge individual contacts 6a, 6b when the domes are depressed to activate the corresponding key. In the drawings only two domes 11 are shown, although it will be understood that there are as many domes as are required for the number of keys desired.

The individual contacts 6a, 6b are connected by conductive tracks 4 to a row of rectangular contacts 13 provided along the edge 8 of the printed circuit 5. The contacts 13 can be made in the same manner as the conductive tracks 4, for example by screening.

A corresponding row of rectangular contacts 14 is placed immediately adjacent the edge 8 in opposing positions to the corresponding contacts 13 on the protruding portion 9 of the underlying printed circuit board 1.

So far the contacts 13 and 14 line up, but they do not make electrical contact.

In accordance with the principles of the invention, a row of rectangular, electrically conductive bridging members or jumpers 15 is formed on the underside of the membrane in locations such that when the membrane 10 is firmly located on top of the printed circuits 1 and 5, the jumpers 15 overlie the opposing contacts 13, 14 on the two printed circuits and thereby establish electrical contact between them.

The jumpers 15 can be screened onto the underside of the membrane 10 or alternatively formed by making strips of the elastomer conductive in a manner known per se. The membrane 10 is of course slightly larger than usual so as to extend onto the protruding portion 9 of the underlying printed circuit 1. Locating pins 16 on the printed circuit 5 lines up with corresponding holes 17 on the membrane 10 to ensure its correct positioning.

Some slight pressure needs to be exerted on the assembly to hold it together and maintain the jumpers in contact with the contacts 13, 14. This can be achieved in a conventional manner by means of an external snap-fit housing (not shown), which holds the assembly together in a press fit.

The described assembly is thus convenient to make and well suited for production line assembly operations. It also takes up minimal space allowing the size of the device to be reduced.

I claim:

1. The keypad assembly comprising a lower printed circuit board having conductive paths formed on an upper surface thereof, an upper printed circuit board having conductive paths formed on an upper surface thereof leading to a keypad array, said upper printed circuit board lying partially on said lower printed circuit board in a staggered relationship so that an edge of said upper printed circuit board lies on the upper surface of said lower printed circuit board, said lower printed circuit board having a portion protruding beyond said edge of said upper printed circuit board, a first set of contact members formed on said upper printed circuit board adjacent said edge of said upper printed circuit board, a second set of corresponding contact members formed on said protruding portion of said lower printed circuit board in opposing relationship to said first set of contact members, and a planar sheet member incorporating dome actuators for said keypad fitted over said upper and lower printed circuit boards, said planar sheet member being provided on the underside thereof with planar conductive strips bridging corresponding opposing pairs of said contact members to establish electrical contact therebetween.

2. A keypad assembly as claimed in claim 1, wherein said sheet member is an elastomeric membrane.

3. A keypad assembly as claimed in claim 2, wherein said conductive strips of portions of said membrane rendered conductive.

4. The keypad assembly as claimed in claim 1, wherein said upper printed circuit board is a flexible printed circuit board.

5. A keypad assembly as claimed in claim 1, wherein said contact members are conductive strips provided respectively on said upper and lower printed circuit board.

6. A method of assembling a keypad, comprising the steps of placing an upper printed circuit board having conductive paths leading to a keypad array formed on an upper surface thereof over a lower printed circuit board having conductive paths formed on an upper surface thereof such that said upper printed circuit board partially overlies said lower printed circuit board in a staggered relationship with an edge of the upper printed circuit board lying on a protruding portion of the upper surface of the lower printed circuit board, aligning a first set of contact members formed on said upper printed circuit board adjacent said edge thereof with a second set of corresponding contact members formed on said protruding portion of said lower printed circuit board, and fitting a planar sheet member incorporating dome actuators for the keypad over said printed circuit boards, said planar sheet member being provided on the underside thereof with planar conductive strips bridging corresponding opposing pairs of said contact members to establish electrical contact therebetween.

7. The method as claimed in claim 6, wherein said sheet member is an elastomeric membrane press fitted onto said upper and lower printed circuit boards.

8. The method as claimed in claim 7, wherein said conductive strips are conductive tracks screened onto the underside of said membrane.

9. The method as claimed in claim 7, wherein said conductive strips are strip s of said membrane rendered conductive.

\* \* \* \* \*